(12) United States Patent
Kobayashi

(10) Patent No.: US 10,730,059 B2
(45) Date of Patent: Aug. 4, 2020

(54) SUBSTRATE PROCESSING METHOD AND SUBSTRATE PROCESSING APPARATUS

(71) Applicant: SCREEN Holdings Co., Ltd., Kyoto (JP)

(72) Inventor: Kenji Kobayashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 126 days.

(21) Appl. No.: 15/058,565

(22) Filed: Mar. 2, 2016

(65) Prior Publication Data

US 2016/0256901 A1     Sep. 8, 2016

(30) Foreign Application Priority Data

Mar. 5, 2015 (JP) .................................. 2015-43708
Feb. 17, 2016 (JP) .................................. 2016-28312

(51) Int. Cl.
  *B05B 1/14* (2006.01)
  *B05B 1/00* (2006.01)
  *H01L 21/67* (2006.01)

(52) U.S. Cl.
  CPC ............... *B05B 1/14* (2013.01); *B05B 1/005* (2013.01); *H01L 21/67028* (2013.01); *H01L 21/67051* (2013.01)

(58) Field of Classification Search
  None
  See application file for complete search history.

(56) References Cited

U.S. PATENT DOCUMENTS

| | | | |
|---|---|---|---|
| 2004/0084144 A1 | 5/2004 | Yokouchi et al. | 156/345.11 |
| 2006/0021636 A1 | 2/2006 | Miya | 134/33 |
| 2007/0238028 A1 | 10/2007 | Inatomi | 430/5 |
| 2008/0092929 A1 | 4/2008 | Yokouchi | 134/30 |
| 2009/0101181 A1 | 4/2009 | Morisawa et al. | 134/94.1 |
| 2009/0107400 A1 | 4/2009 | Miya | 118/715 |
| 2010/0101497 A1* | 4/2010 | Izuta | H01L 21/67028 118/730 |
| 2010/0293806 A1* | 11/2010 | Liu | C11D 11/0041 34/239 |
| 2014/0053869 A1 | 2/2014 | Chen et al. | 134/6 |

(Continued)

FOREIGN PATENT DOCUMENTS

| | | |
|---|---|---|
| CN | 1727081 A | 2/2006 |
| CN | 101425452 A | 5/2009 |

(Continued)

*Primary Examiner* — Mikhail Kornakov
*Assistant Examiner* — Pradhuman Parihar
(74) *Attorney, Agent, or Firm* — Ostrolenk Faber LLP

(57) ABSTRACT

A substrate processing method includes a first gas discharge step of discharging, from a first discharge port, a first gas containing a vapor of a low surface tension liquid having a lower surface tension than a processing liquid and spraying, to a liquid film of the processing liquid, the first gas from a direction intersecting the upper surface such that a liquid film removal region where the liquid film is removed from the liquid film of the processing liquid is formed, a second gas discharge step of discharging a second gas containing a vapor of a low surface tension liquid having a lower surface tension than the processing liquid from an annular second discharge port different from the first discharge port laterally and radially and a liquid film removal region enlargement step of enlarging the liquid film removal region.

10 Claims, 10 Drawing Sheets

(56) References Cited

U.S. PATENT DOCUMENTS

| | | |
|---|---|---|
| 2014/0065295 A1 | 3/2014 | Emoto et al. .................... 427/8 |
| 2014/0231013 A1 | 8/2014 | Hinode et al. ........... 156/345.23 |
| 2014/0261571 A1 | 9/2014 | Goto et al. ..................... 134/33 |
| 2014/0290703 A1 | 10/2014 | Kobayashi et al. ............ 134/33 |
| 2016/0042980 A1 | 2/2016 | Ohashi .................... 156/345.18 |

FOREIGN PATENT DOCUMENTS

| | | |
|---|---|---|
| JP | 2005-310953 A | 11/2005 |
| JP | 2007-036152 A | 2/2007 |
| JP | 2008-034428 A | 2/2008 |
| JP | 2008-243935 A | 10/2008 |
| JP | 2010-056218 A | 3/2010 |
| JP | 2013-201334 A | 10/2013 |
| JP | 2014-179491 A | 9/2014 |
| JP | 2014-197571 A | 10/2014 |
| KR | 10-2008-0035973 | 4/2008 |
| KR | 10-2014-0113330 | 9/2014 |
| TW | 201442104 A | 11/2014 |
| TW | 201445628 A | 12/2014 |

\* cited by examiner

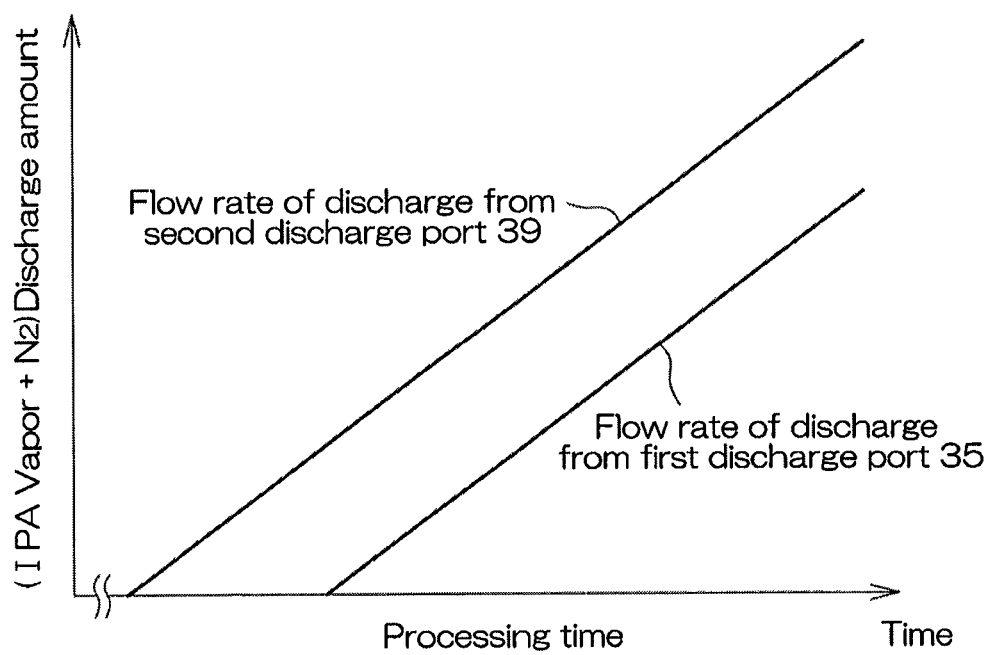

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus that use a processing liquid to process the upper surface of a substrate. Examples of the substrate to be processed include semiconductor wafers, substrates for liquid crystal displays, substrates for plasma displays, substrates for FEDs (Field Emission Displays), substrates for optical discs, substrates for magnetic discs, substrates for optical magnetic discs, substrates for photomasks, ceramic substrates and substrates for solar cells.

2. Description of Related Art

In the manufacturing process of a semiconductor device, a processing liquid is supplied to the surface of a substrate such as a semiconductor wafer, and the surface of the substrate is processed with the processing liquid.

For example, a single substrate processing type substrate processing apparatus that processes substrates one by one includes a spin chuck that rotates the substrate while holding the substrate substantially horizontally and a nozzle for supplying a processing liquid to the upper surface of the substrate rotated by the spin chuck. For example, a chemical liquid is supplied to the substrate held by the spin chuck, thereafter a rinse liquid is supplied and thus the chemical liquid on the substrate is replaced with the rinse liquid. Then, drying processing for removing the rinse liquid on the upper surface of the substrate is performed.

As the drying processing, a method is known of supplying the vapor of isopropyl alcohol (IPA) whose boiling point is lower than that of water to the front surface of the substrate being rotated so as to reduce watermark generation. For example, rotagoni drying (see US Patent Application No. 2009/0101181 A1) is an example of this method.

SUMMARY OF THE INVENTION

Specifically, as the drying method described above, the liquid film of the processing liquid (rinse liquid) is formed on the upper surface of the substrate, the vapor of a low surface tension liquid (IPA) is sprayed to the liquid film of the processing liquid and thus a liquid film removal region is formed. Then, the liquid film removal region is enlarged, the liquid film removal region is spread over the entire region of the upper surface of the substrate and thus the upper surface of the substrate is dried.

However, in such a drying method, on the surface (processing target surface) of the substrate after the drying, particles may be generated.

Hence, an object of the present invention is to provide a substrate processing method and a substrate processing apparatus that can dry the upper surface of a substrate while reducing or preventing particles.

The inventors of the present application consider that the causes of particle generation in the drying method (such as rotagoni drying) using the vapor of a low surface tension liquid are as follows. Specifically, as a result of processing using a processing liquid, particles may be contained in the liquid film of the processing liquid formed on the upper surface of the substrate. When the liquid film removal region is enlarged, a boundary between the upper surface of the substrate, the liquid film of the processing liquid and a gas phase (having a three-phase interface of solid-liquid-gas) is moved outward (that is, the side of the liquid film of the processing liquid). As the liquid film removal region is enlarged, particles are contained in a portion near the boundary between the liquid film of the processing liquid, the upper surface of the substrate and the gas phase (referred to as a "boundary portion of the liquid film of the processing liquid," hereinafter, the same is true in this section).

Within the boundary portion of the liquid film of this processing liquid, thermal convection is generated. The thermal convection flows in a direction approaching the boundary between the liquid film of the processing liquid, the upper surface of the substrate and the gas phase. Hence, when particles are contained in the boundary portion of the liquid film of the processing liquid, the particles are induced by the thermal convection in a direction toward the boundary with the upper surface of the substrate and the gas phase, and are moved from the boundary to the liquid film removal region to appear on the upper surface of the substrate. Then, the particles are left on the upper surface of the substrate after the liquid film of the processing liquid is removed. The inventors of the present application consider that this is a mechanism for particle generation.

The inventor of the present application have found that when the ambient atmosphere of the boundary between the liquid film of the processing liquid, the upper surface of the substrate and the gas phase is in a state where the vapor of a low surface tension liquid having a lower surface tension than that of the processing liquid is rich, no thermal convection is generated within the boundary portion of the liquid film of the processing liquid, and moreover, within the boundary portion of the liquid film of the processing liquid, Marangoni convection flowing in a direction (that is, a direction opposite to the thermal convection) apart from the boundary between the liquid film of the processing liquid, the upper surface of the substrate and the gas phase is generated.

According to this invention, there is provided a substrate processing method including a substrate holding step of holding a substrate horizontally, a liquid film formation step of supplying a processing liquid to an upper surface of the substrate to form a liquid film of the processing liquid covering the upper surface of the substrate, a first gas discharge step of, after the liquid film formation step, discharging, from a first discharge port, a first gas containing a vapor of a low surface tension liquid having a lower surface tension than the processing liquid and spraying, to the liquid film of the processing liquid, the first gas from a direction intersecting the upper surface such that a liquid film removal region where the liquid film is removed from the liquid film of the processing liquid is formed, a second gas discharge step of discharging a second gas containing a vapor of a low surface tension liquid having a lower surface tension than the processing liquid from an annular second discharge port different from the first discharge port laterally and radially, and a liquid film removal region enlargement step of enlarging the liquid film removal region.

According to this method, the first gas containing the vapor of the low surface tension liquid is sprayed to the liquid film of the processing liquid formed on the upper surface of the substrate from the direction intersecting the upper surface of the substrate, and thus the liquid film removal region is formed in the liquid film of the processing liquid. The liquid film removal region is enlarged, and thus the boundary between the upper surface of the substrate, the liquid film of the processing liquid and the gas phase is moved outward of the substrate. The liquid film removal region is enlarged over the entire region of the substrate, and thus the entire region of the upper surface of the substrate is dried.

The second gas containing the vapor of the low surface tension liquid is discharged from the annular second discharge port laterally and radially. The second gas discharged from the second discharge port is supplied to the surrounding area of the liquid film of the processing liquid formed on the upper surface of the substrate. Thus, the ambient atmosphere of the liquid film of the processing liquid can be kept in a state where the vapor of the low surface tension is rich. Hence, after the formation of the liquid film removal region, the ambient atmosphere of the boundary between the upper surface of the substrate, the liquid film of the processing liquid and the gas phase can be kept in a state where the vapor of the low surface tension liquid is rich. In this way, within the boundary portion of the liquid film of the processing liquid, the Marangoni convection flowing in a direction apart from the boundary between the liquid film of the processing liquid, the upper surface of the substrate and the gas phase can be generated, and the Marangoni convection generated can be maintained.

Hence, when particles are contained in the liquid film of the processing liquid, the particles are induced by the Marangoni convection in the direction apart from the boundary with the upper surface of the substrate and the gas phase. Thus, the liquid film removal region can be enlarged in a state where the particles in the liquid film of the processing liquid are kept in the liquid film. The particles in the liquid film of the processing liquid are removed from the upper surface of the substrate together with the liquid film of the processing liquid without appearing in the liquid film removal region. Hence, after the drying of the substrate, the particles are prevented from being left on the upper surface of the substrate. In this way, it is possible to dry the entire region of the upper surface of the substrate while reducing or preventing particle generation.

For example, it can be considered that while the entire region of the interior of a chamber accommodating a substrate holding unit is being filled with the atmosphere of the vapor of the low surface tension liquid, the vapor of the low surface tension liquid is blown to the liquid film of the processing liquid. However, in this case, it is necessary to fill the entire region of the interior of the chamber with the atmosphere of the vapor of the low surface tension liquid, and thus the amount of low surface tension liquid consumed is significantly increased.

By contrast, according to the method described above, the second gas is discharged from the second discharge port laterally and radially, and thus the ambient atmosphere of the boundary between the upper surface of the substrate, the liquid film of the processing liquid and the gas phase can be kept in the state where the vapor of the low surface tension liquid is rich. In this way, it is possible to satisfactorily dry the upper surface of the substrate while reducing the low surface tension liquid.

According to a preferred embodiment of this invention, the second discharge port is arranged higher than the first discharge port with respect to a vertical direction. According to this method, since the second discharge port is arranged higher than the first discharge port, the flow of the second gas discharged from the second discharge port can interrupt the surrounding area of the boundary between the upper surface of the substrate, the liquid film of the processing liquid and the gas phase from the region higher than the second discharge port. In this way, it is possible to keep the surrounding area of the boundary between the liquid film of the processing liquid, the upper surface of the substrate and the gas phase in a state where the vapor of the low surface tension liquid is richer.

In the substrate processing method described above, the first gas discharge step and the second gas discharge step may be performed simultaneously. According to this method, since the discharge of the first gas from the first discharge port and the discharge of the second gas from the second discharge port are performed simultaneously, when the liquid film removal region is enlarged, the ambient atmosphere of the boundary between the upper surface of the substrate, the liquid film of the processing liquid and the gas phase can be kept in the state where the vapor of the low surface tension liquid is rich. In this way, within the boundary portion of the liquid film of the processing liquid, the Marangoni convection flowing in the direction apart from the boundary between the liquid film of the processing liquid, the upper surface of the substrate and the gas phase can be generated.

The second gas discharge step may be started before start of the first gas discharge step. According to this method, since the discharge of the second gas from the second discharge port is started before the start of the discharge of the first gas from the first discharge port, the formation of the liquid film removal region can be started with the atmosphere in the vicinity of the upper surface of the substrate in the state where the vapor of the low surface tension liquid is rich.

The liquid film removal region enlargement step may include a first flow rate increasing step of gradually increasing a flow rate of the first gas discharged from the first discharge port after start of the discharge of the first gas. In this case, the substrate processing method may further include a second flow rate increasing step of gradually increasing a flow rate of the second gas discharged from the second discharge port after start of the discharge of the second gas.

In this method, after the start of the discharge of the first gas, the flow rate of the first gas is gradually increased, and thus the liquid film removal region can be enlarged. Here, since the flow rate of the second gas is also gradually increased after the start of the discharge of the second gas, regardless of the conditions of the enlargement of the liquid film removal region, the ambient atmosphere of the boundary between the upper surface of the substrate, the liquid film of the processing liquid and the gas phase can be kept in the state where the vapor of the low surface tension liquid is rich.

The processing liquid may include a rinse liquid, and the low surface tension liquid may include an organic solvent.

According to this method, the first gas containing the vapor of the low surface tension liquid is sprayed to the liquid film of the rinse liquid formed on the upper surface of the substrate from the direction intersecting the upper surface of the substrate, and thus the liquid film removal region is formed in the liquid film of the rinse liquid. The liquid film removal region is enlarged, and thus the boundary between the upper surface of the substrate, the liquid film of the rinse liquid and the gas phase is moved outward of the substrate. The liquid film removal region is enlarged over the entire region of the substrate, and thus the entire region of the upper surface of the substrate is dried.

The second gas containing the vapor of the low surface tension liquid is discharged from the annular second discharge port laterally and radially. The second gas discharged from the second discharge port is supplied to the surrounding area of the liquid film of the rinse liquid formed on the upper surface of the substrate. Thus, the ambient atmosphere of the liquid film of the rinse liquid can be kept in the state where the vapor of the low surface tension is rich. Hence, after the formation of the liquid film removal region, the ambient atmosphere of the boundary between the upper surface of the substrate, the liquid film of the rinse liquid and the gas phase can be kept in the state where the vapor of the low surface tension liquid is rich. In this way, within the boundary portion of the liquid film of the rinse liquid, the Marangoni convection flowing in the direction apart from the boundary between the liquid film of the processing liquid, the upper surface of the substrate and the gas phase can be generated, and the Marangoni convection generated can be maintained.

Hence, when particles are contained in the liquid film of the rinse liquid, the particles are induced by the Marangoni convection in the direction apart from the boundary with the upper surface of the substrate and the gas phase. Thus, the liquid film removal region can be enlarged in the state where the particles in the liquid film of the rinse liquid are kept in the liquid film. The particles in the liquid film of the rinse liquid are removed from the upper surface of the substrate together with the liquid film of the rinse liquid without appearing in the liquid film removal region. Hence, after the drying of the substrate, the particles are prevented from being left on the upper surface of the substrate. In this way, it is possible to dry the entire region of the upper surface of the substrate while reducing or preventing particle generation.

According to this invention, there is provided a substrate processing apparatus including a substrate holding unit that holds a substrate horizontally, a processing liquid supply unit that supplies a processing liquid to an upper surface of the substrate, a nozzle that includes a first discharge port which discharges a gas downward and an annular second discharge port which discharges a gas laterally, a first gas supply unit that supplies, to the first discharge port, a first gas containing a vapor of a low surface tension liquid having a lower surface tension than the processing liquid, a second gas supply unit that supplies, to the second discharge port, a second gas containing a vapor of a low surface tension liquid having a lower surface tension than the processing liquid, a substrate rotation unit that rotates a substrate held in the substrate holding unit, and a control unit that controls the processing liquid supply unit, the first gas supply unit, the second gas supply unit, and the substrate rotation unit, where the control unit performs a liquid film formation step of supplying the processing liquid to the upper surface of the substrate to form a liquid film of the processing liquid covering the upper surface of the substrate, a first gas discharge step of, after the liquid film formation step, discharging, from the first discharge port, the first gas and spraying, to the liquid film of the processing liquid, the first gas such that a liquid film removal region where the liquid film is removed from the liquid film of the processing liquid is formed, a second gas discharge step of discharging the second gas from the second discharge port laterally and radially and a liquid film removal region enlargement step of enlarging the liquid film removal region.

According to this configuration, the first gas containing the vapor of the low surface tension liquid is sprayed to the liquid film of the processing liquid formed on the upper surface of the substrate from the direction intersecting the upper surface of the substrate, and thus the liquid film removal region is formed in the liquid film of the processing liquid. The liquid film removal region is enlarged, and thus the boundary between the upper surface of the substrate, the liquid film of the processing liquid and the gas phase is moved outward of the substrate. The liquid film removal region is enlarged over the entire region of the substrate, and thus the entire region of the upper surface of the substrate is dried.

The second gas containing the vapor of the low surface tension liquid is discharged from the annular second discharge port laterally and radially. The second gas discharged from the second discharge port is supplied to the surrounding area of the liquid film of the processing liquid formed on the upper surface of the substrate. Thus, the ambient atmosphere of the liquid film of the processing liquid can be kept in a state where the vapor of the low surface tension is rich. Hence, after the formation of the liquid film removal region, the ambient atmosphere of the boundary between the upper surface of the substrate, the liquid film of the processing liquid and the gas phase can be kept in a state where the vapor of the low surface tension liquid is rich. In this way, within the boundary portion of the liquid film of the processing liquid, the Marangoni convection flowing in a direction apart from the boundary between the liquid film of the processing liquid, the upper surface of the substrate and the gas phase can be generated, and the Marangoni convection generated can be maintained.

Hence, when particles are contained in the liquid film of the processing liquid, the particles are induced by the Marangoni convection in the direction apart from the boundary with the upper surface of the substrate and the gas phase. Thus, the liquid film removal region can be enlarged in a state where the particles in the liquid film of the processing liquid are kept in the liquid film. The particles in the liquid film of the processing liquid are removed from the upper surface of the substrate together with the liquid film of the processing liquid without appearing in the liquid film removal region. Hence, after the drying of the substrate, the particles are prevented from being left on the upper surface of the substrate. In this way, it is possible to dry the entire region of the upper surface of the substrate while reducing or preventing particle generation.

For example, it can be considered that while the entire region of the interior of a chamber accommodating a substrate holding unit is being filled with the atmosphere of the vapor of the low surface tension liquid, the vapor of the low surface tension liquid is blown to the liquid film of the processing liquid. However, in this case, it is necessary to fill the entire region of the interior of the chamber with the atmosphere of the vapor of the low surface tension liquid, and thus the amount of low surface tension liquid consumed is significantly increased.

By contrast, according to this configuration, the second gas is discharged from the second discharge port laterally and radially, and thus the ambient atmosphere of the boundary between the upper surface of the substrate, the liquid film of the processing liquid and the gas phase can be kept in the state where the vapor of the low surface tension liquid is rich. In this way, it is possible to satisfactorily dry the upper surface of the substrate while reducing the low surface tension liquid.

According to a preferred embodiment of this invention, the nozzle includes a first cylindrical member within which a first flow path along which the first gas is passed is formed, a lower end portion of the cylindrical member forms the first discharge port, a flange is formed in the lower end portion of the first cylindrical member and the first gas discharged from the first discharge port is passed through a space between the upper surface of the substrate and the flange.

According to this configuration, the first gas discharged from the first discharge port is passed through the space between the upper surface of the substrate and the flange, and is discharged radially and laterally between the outer circumferential end of the flange and the substrate. Hence, after the formation of the liquid film removal region, the first gas flows from between the outer circumferential end of the flange and the substrate along the upper surface of the substrate outward in the circumferential direction and radially. In this way, it is possible to supply the first gas to the surrounding area of the boundary between the upper surface of the substrate, the liquid film of the processing liquid and the gas phase, and the surrounding area of the boundary between the liquid film of the processing liquid, the upper surface of the substrate and the gas phase can be kept in the state where the vapor of the low surface tension liquid is rich.

The second discharge port may be arranged higher than the flange.

According to this configuration, the second discharge port is arranged higher than the flange. Hence, the flow of the second gas discharged from the second discharge port can interrupt the surrounding area of the boundary between the upper surface of the substrate, the liquid film of the processing liquid and the gas phase from the region higher than the second discharge port. In this way, it is possible to keep the surrounding area of the boundary between the liquid film of the processing liquid, the upper surface of the substrate and the gas phase in a state where the vapor of the low surface tension liquid is richer.

The nozzle may further include a second cylindrical member that encloses the first cylindrical member and that defines, between the nozzle and the first cylindrical member, a second flow path along which the second gas is passed. In this case, the second discharge port may be formed with the second cylindrical member and the flange.

According to this configuration, since the second discharge port and the area between the outer circumferential end of the flange and the substrate are aligned in an up/down direction, the second gas discharged from the second discharge port is supplied to the surrounding area of the boundary between the upper surface of the substrate, the liquid film of the processing liquid and the gas phase. In this way, the surrounding area of the boundary between the liquid film of the processing liquid, the upper surface of the substrate and the gas phase can be kept in the state where the vapor of the low surface tension liquid is much richer.

The substrate processing apparatus may further include an opposite member that is opposite to the upper surface of the substrate and that includes an opposite surface which guides the second gas discharged from the second discharge port. According to this configuration, the space between the opposite surface and the upper surface of the substrate is filled with the second gas discharged from the second discharge port. Hence, it is possible to reduce the flowing of the second gas out from near the upper surface of the substrate. In this way, the ambient atmosphere of the boundary between the upper surface of the substrate, the liquid film of the processing liquid and the gas phase can be kept in the state where the vapor of the low surface tension liquid is much richer.

The opposite member may include an opposite circumferential edge portion that is opposite to an upper surface circumferential edge portion of the substrate and that forms, between the opposite member and the upper surface circumferential edge portion, a narrow space narrower than a space between a center portion of the opposite surface and an upper surface center portion of the substrate.

According to this configuration, since the narrow space is formed between the opposite circumferential edge portion of the opposite member and the upper surface circumferential edge portion of the substrate, it is difficult for the second gas supplied to the space between the opposite surface and the upper surface of the substrate to be exhausted from the space. Hence, it is possible to further reduce the flowing of the second gas out from near the upper surface of the substrate. In this way, the ambient atmosphere of the boundary between the upper surface of the substrate, the liquid film of the processing liquid and the gas phase can be kept in the state where the vapor of the low surface tension liquid is much richer.

The objects, the features and the effects in the present invention described above or still other objects, features and effects will be more apparent from the following description of preferred embodiments with reference to the accompanying drawings.

BRIEF DESCRIPTION OF THE DRAWINGS

FIG. 5 is a graph showing a relationship between a processing time and the flow rate of discharge of a mixture gas (IPA Vapor+$N_2$) from a first discharge port and a second discharge port.

DETAILED DESCRIPTION OF PREFERRED EMBODIMENTS

Figure 1:
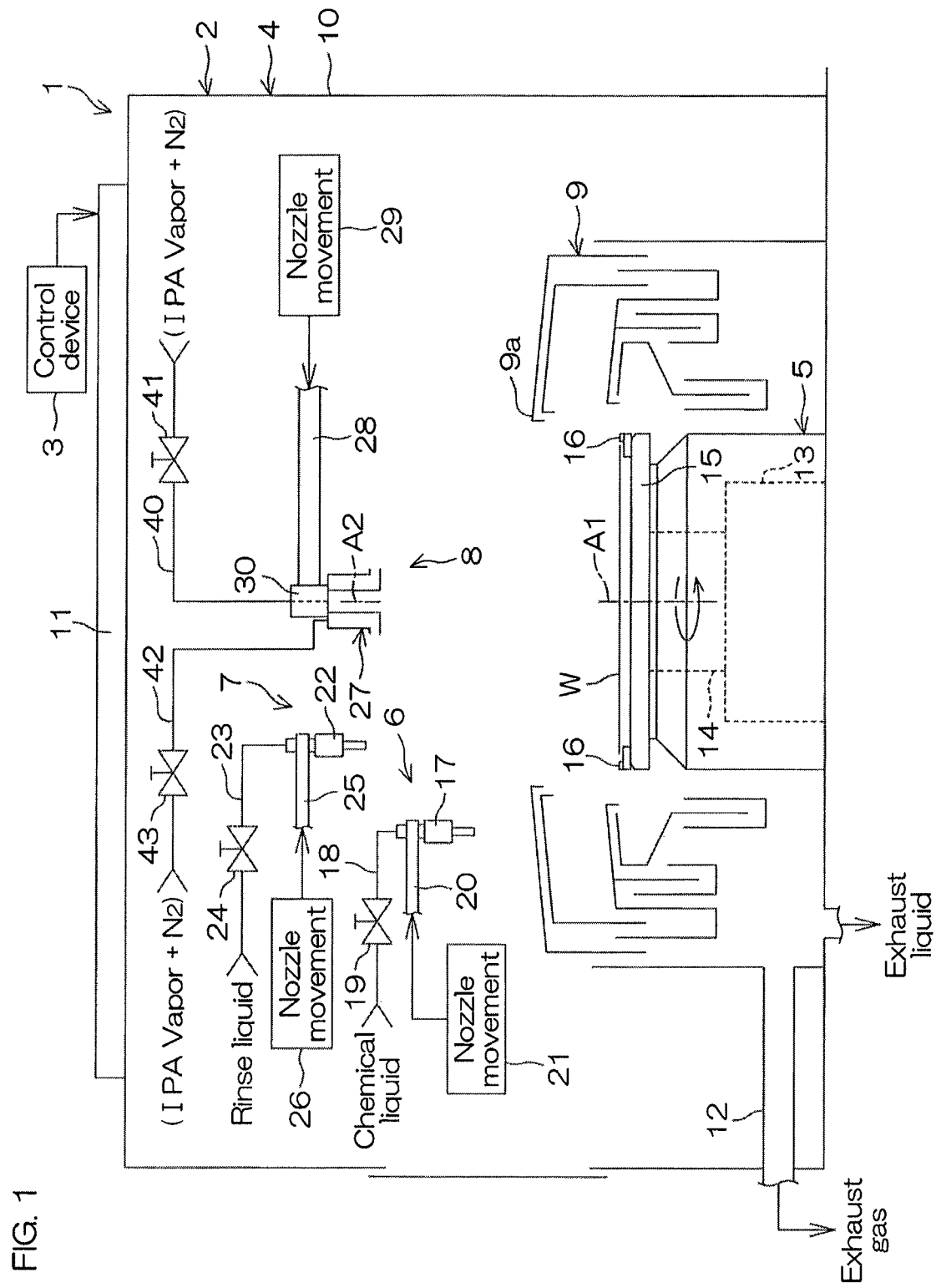
FIG. 1 is a diagram of a substrate processing apparatus according to a first preferred embodiment of the present invention as viewed in a horizontal direction.

FIG. 1 is a diagram of a substrate processing apparatus 1 according to a first preferred embodiment of the present invention as viewed in a horizontal direction.

The substrate processing apparatus 1 is a single substrate processing type device that processes disc-shaped substrates W such as a semiconductor wafer with a processing liquid or a processing gas one by one. The substrate processing apparatus 1 includes a processing unit 2 that uses the processing liquid to process the substrate W and a control device (control unit) 3 that controls the operation of a device included in the substrate processing apparatus 1 and the opening and closing of a valve.

Each processing unit 2 is a single substrate processing type unit. Each processing unit 2 includes a box-shaped chamber 4 that has an internal space, a spin chuck (substrate holding unit) 5 that holds one substrate W in a horizontal position within the chamber 4 and that rotates the substrate W about a vertical rotation axis A1 passing through the center of the substrate W, a chemical liquid supply unit 6 that supplies a chemical liquid to the upper surface of the substrate W held by the spin chuck 5, a rinse liquid supply unit (processing liquid supply unit) 7 that supplies a rinse liquid to the upper surface of the substrate W held by the spin chuck 5, a gas supply unit (a first gas supply unit, a second gas supply unit) 8 that supplies, above the substrate W held by the spin chuck 5, a mixture gas (IPA Vapor+$N_2$) of the vapor of an IPA which is an example of an organic solvent serving as a low surface tension liquid and a $N_2$ gas which is an example of an inert gas and a cylindrical cup 9 that surrounds the periphery of the spin chuck 5.

The chamber 4 includes a box-shaped partition wall 10 that accommodates the spin chuck 5 and the nozzle, a FFU (fan filter unit) 11 that serves as a blower unit which blows a clean air (air filtered by a filter) from an upper portion of the partition wall 10 into the partition wall 10 and an exhaust duct 12 that exhausts a gas from a lower portion of the partition wall 10 into the chamber 4. The FFU 11 is arranged above the partition wall 10, and is attached to the celling of the partition wall 10. The FFU 11 blows the clean air downward from the celling of the partition wall 10 into the chamber 4. The exhaust duct 12 is connected to the bottom portion of the cup 9, and feeds out the gas within the chamber 4 toward an exhaust processing facility provided in a factory where the substrate processing apparatus 1 is installed. Hence, a downflow flowing downward within the chamber 4 is formed by the FFU 11 and the exhaust duct 12. Processing on the substrate W is performed in a state where the downflow is formed within the chamber 4.

As the spin chuck 5, a clamping type chuck is adopted that clamps the substrate W in a horizontal direction to hold the substrate W horizontally. Specifically, the spin chuck 5 includes a spin motor (substrate rotation unit) 13, a spin shaft 14 that is integral with the drive shaft of the spin motor 13 and a disc-shaped spin base 15 that is attached to an upper end of the spin shaft 14 substantially horizontally.

On the upper surface of the spin base 15, in its circumferential edge portion, a plurality of (three or more, for example, six) clamping members 16 are arranged. The clamping members 16 are arranged, in the upper surface circumferential edge portion of the spin base 15, on the circumference corresponding to the outer circumferential shape of the substrate W, with an appropriate space apart from each other.

The spin chuck 5 is not limited to a clamping type, and for example, a vacuum adsorption type (vacuum chuck) may be adopted that vacuum-adsorbs the rear surface of the substrate W to hold the substrate W in a horizontal position and that further rotates, in such a state, about a vertical rotation axis to rotate the substrate W held by the spin chuck 5.

The chemical liquid supply unit 6 includes a chemical liquid nozzle 17 that discharges a chemical liquid, a chemical liquid pipe 18 that is connected to the chemical liquid nozzle 17, a chemical liquid valve 19 that is interposed in the chemical liquid pipe 18, a first nozzle arm 20 in which the chemical liquid nozzle 17 is attached to its tip end portion and a first nozzle movement unit 21 that swings the first nozzle arm 20 to move the chemical liquid nozzle 17.

When the chemical liquid valve 19 is opened, the chemical liquid supplied from the chemical liquid pipe 18 to the chemical liquid nozzle 17 is discharged downward from the chemical liquid nozzle 17. When the chemical liquid valve 19 is closed, the discharge of the chemical liquid from the chemical liquid nozzle 17 is stopped. The first nozzle movement unit 21 moves the chemical liquid nozzle 17 along the upper surface of the substrate W, and thereby moves the supply position of the chemical liquid within the upper surface of the substrate W. Furthermore, the first nozzle movement unit 21 moves the chemical liquid nozzle 17 between a processing position where the chemical liquid discharged from the chemical liquid nozzle 17 is supplied to the upper surface of the substrate W and a retraction position where the chemical liquid nozzle 17 is retracted, in a plan view, to the side of the spin chuck 5.

As the chemical liquid discharged from the chemical liquid nozzle 17, a solution can be illustrated that contains at least one of sulfuric acid, acetic acid, nitric acid, hydrochloric acid, hydrofluoric acid, ammonia water, hydrogen peroxide, organic acids (such as citric acid and oxalic acid), an organic alkali (for example, TMAH: tetramethyl ammonium hydroxide), a surface active agent and a corrosion inhibitor.

The rinse liquid supply unit 7 includes a rinse liquid nozzle 22 that discharges water, a rinse liquid pipe 23 that is connected to the rinse liquid nozzle 22, a rinse liquid valve 24 that is interposed in the rinse liquid pipe 23, a second nozzle arm 25 in which the rinse liquid nozzle 22 is attached to its tip end portion and a second nozzle movement unit 26 that swings the second nozzle arm 25 to move the rinse liquid nozzle 22.

When the rinse liquid valve 24 is opened, the water supplied from the rinse liquid pipe 23 to the rinse liquid nozzle 22 is discharged downward from the rinse liquid nozzle 22. When the rinse liquid valve 24 is closed, the discharge of the water from the rinse liquid nozzle 22 is stopped. The second nozzle movement unit 26 moves the rinse liquid nozzle 22 along the upper surface of the substrate W to move the supply position of the water within the upper surface of the substrate W. Furthermore, the second nozzle movement unit 2 moves the rinse liquid nozzle 22 between a processing position where the water discharged from the rinse liquid nozzle 22 is supplied to the upper surface of the substrate W and a retraction position where the rinse liquid nozzle 22 is retracted, in a plan view, to the side of the spin chuck 5.

The rinse liquid discharged from the rinse liquid nozzle 22 is, for example, DIW (deionized water). The water is not limited to DIW, and may be any one of carbonated water, electrolytic ion water, hydrogen water, ozone water and hydrochloric acid water of a dilute concentration (for example, about 10 to 100 ppm).

The gas supply unit 8 includes a gas nozzle (nozzle) 27 that discharges the mixture gas (IPA Vapor+$N_2$), a third nozzle arm 28 in which the gas nozzle 27 is attached to its tip end portion and a third nozzle movement unit 29 that swings the third nozzle arm 28 to move the gas nozzle 27.

Figure 2:
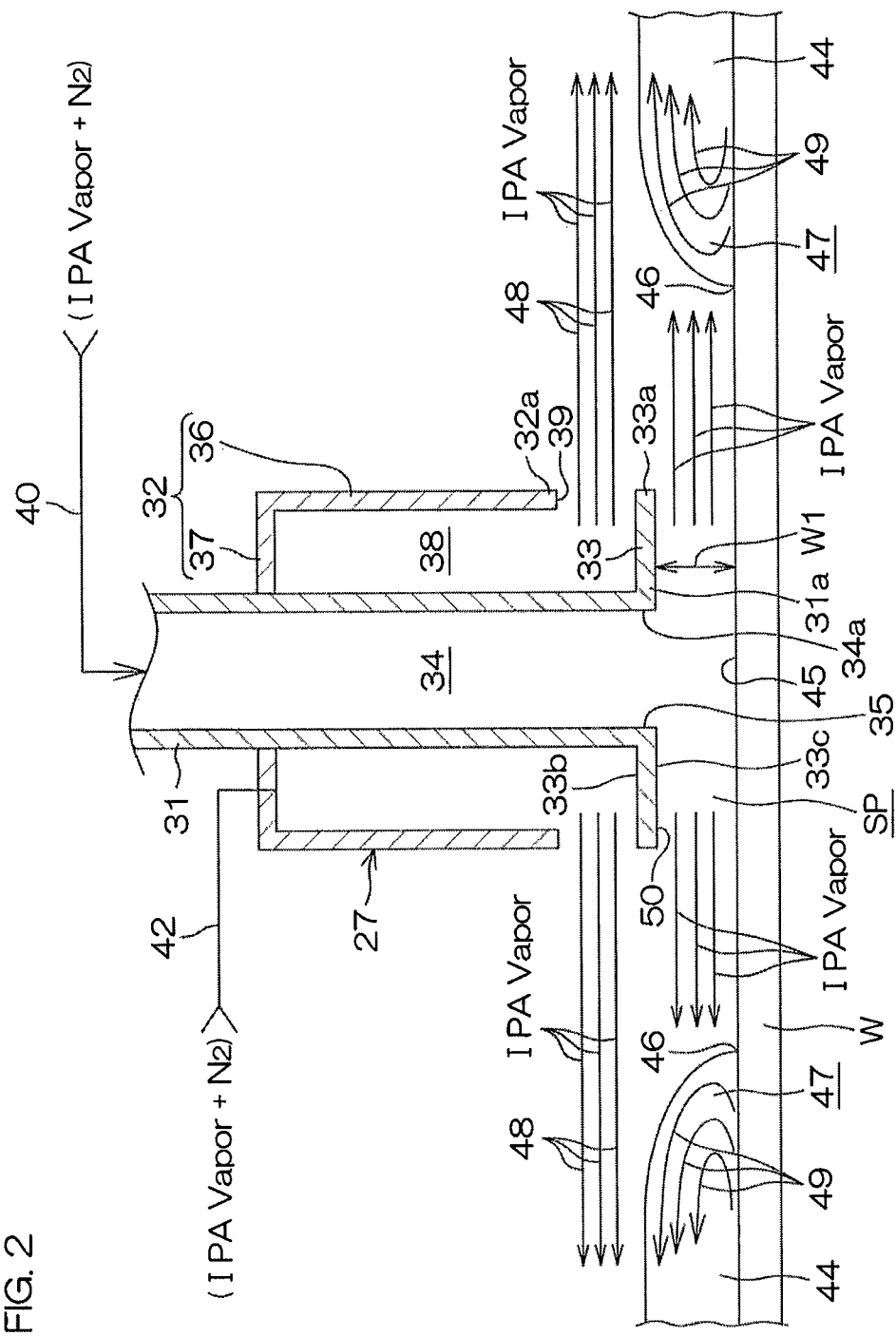
FIG. 2 is an enlarged cross-sectional view showing a state where a vapor nozzle included in the substrate processing apparatus discharges a mixture gas (IPA Vapor+$N_2$).

FIG. 2 is an enlarged cross-sectional view showing a state where the gas nozzle 27 included in the substrate processing apparatus 1 discharges the mixture gas (IPA Vapor+$N_2$).

Figure 3:
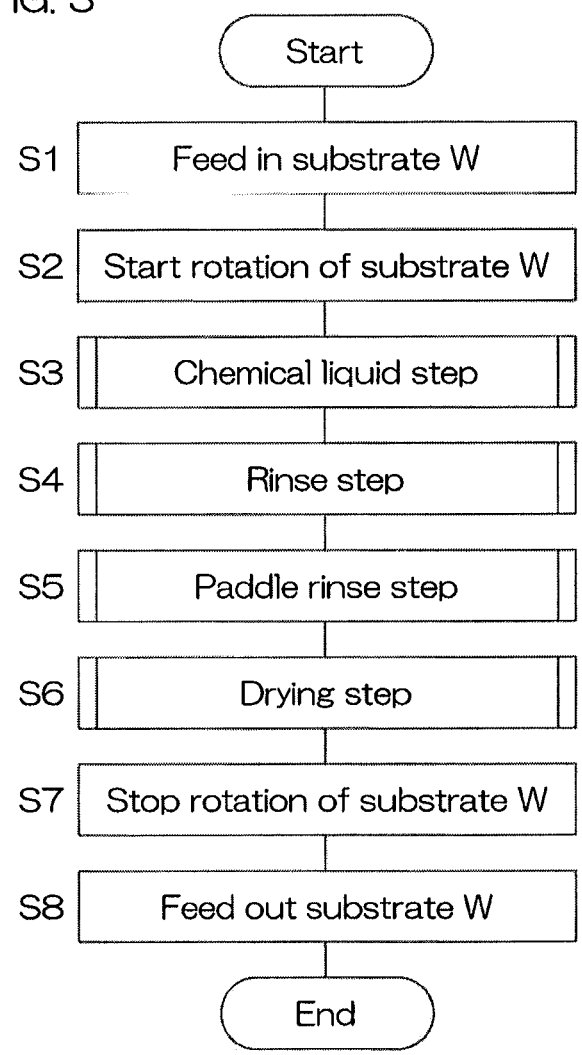
FIG. 3 is a flowchart for illustrating a first processing example of processing performed by the substrate processing apparatus.

The gas nozzle 27 includes an inner cylinder (first cylindrical member) 31 and an outer cylinder (second cylindrical member) 32 that is externally fitted to the inner cylinder 31 and that surrounds the circumference of the inner cylinder 31. The inner cylinder 31 and the outer cylinder 32 are arranged coaxially on a common vertical axis A2. As shown in FIG. 3, the inner cylinder 31 is cylindrical except a lower end portion 31a. In the lower end portion 31a of the inner cylinder 31, a flat flange 33 that is extended in a horizontal direction is formed. The upper surface 33b and the lower surface 33c of the flange 33 each include a horizontally flat horizontal wall. Although FIG. 2 shows that the outer circumferential end 33a of the flange 33 is flush with, in a plan view, the outer circumference of the outer cylinder 32, the outer circumferential end 33a of the flange 33 may be extended outward of the outer cylinder 32 in a radial direction. The internal space of the inner cylinder 31 serves as a straight first gas flow path 34 along which the mixture gas (IPA Vapor+$N_2$) from a first gas pipe 40 which will be described later is passed. The lower end of the first gas flow path 34 forms a first discharge port 35.

The outer cylinder 32 includes a cylindrical portion 36 and a closing portion 37 that closes the upper end portion of the cylindrical portion 36. An area between the outer circumference of the inner cylinder 31 and the inner circumference of the closing portion 37 is sealed with a seal member (not shown) in a liquid-tight manner. Between the inner cylinder 31 and the cylindrical portion 36 of the outer cylinder 32, a cylindrical second gas flow path 38 is formed along which the processing liquid from a second gas pipe 42 which will be described later is passed. The inner cylinder 31 and the outer cylinder 32 are individually formed of a resin material such as vinyl chloride, PCTFE (polychlorotrifluoroethylene), PVDF (polyvinylidene fluoride), PTFE (polytetrafluoroethylene) or PFA (perfluoro-alkylvinyl-ether-tetrafluoro-ethlene-copolymer).

In the lower end portion of the outer cylinder 32, an annular second discharge port 39 is defined by the lower end edge 32a of the outer cylinder 32 and the outer circumferential end 33a of the flange 33 of the inner cylinder 31. Since the upper surface 33b of the flange 33 is a horizontally flat surface, in the process in which the mixture gas (IPA Vapor+$N_2$) flows along the second gas flow path 38 toward the second discharge port 39, a flow in the horizontal direction is formed, and thus the second discharge port 39 discharges, radially in the horizontal direction, the mixture gas (IPA Vapor+$N_2$) passed along the second gas flow path 38.

The gas supply unit 8 further includes a first gas pipe 40 that is connected to the first gas flow path 34 of the gas nozzle 27, a first gas valve 41 that is interposed in the first gas pipe 40, a second gas pipe 42 that is connected to the second gas flow path 38 of the gas nozzle 27 and a second gas valve 43 that is interposed in the second gas pipe 42. When the first gas valve 41 is opened, the mixture gas (IPA Vapor+$N_2$) supplied from the first gas pipe 40 to the first gas flow path 34 of the gas nozzle 27 is discharged downward from the first discharge port 35. When the second gas valve 43 is opened, the mixture gas (IPA Vapor+$N_2$) supplied from the second gas pipe 42 to the second gas flow path 38 of the gas nozzle 27 is discharged from the second discharge port 39 radially in the horizontal direction.

When the substrate processing apparatus 1 processes the substrate W, the gas nozzle 27 is arranged in such a lower position that the lower surface 33c of the flange 33 is opposite to the upper surface of the substrate W with a predetermined space W1 (for example, about 6 mm) apart. When in this state, the first gas valve 41 is opened, the mixture gas (IPA Vapor+$N_2$) discharged from the first discharge port 35 is sprayed to the upper surface of the substrate W. The mixture gas (IPA Vapor+$N_2$) discharged from the first discharge port 35 flows in a space SP between the lower surface 33c of the flange 33 and the upper surface of the substrate W, and is discharged, radially in the horizontal direction, from an annular port 50 formed between the outer circumferential end 33a of the flange 33 and the substrate W. The control device 3 is arranged using, for example, a microcomputer. The control device 3 has a calculating unit, such as a CPU, etc., a storage unit, such as a fixed memory device, hard disk drive, etc., and an input/output unit. A program executed by the calculating unit is stored in the storage unit.

The control device 3 controls, according to a predetermined program, the operations of the spin motor 13, the first nozzle movement unit 26, the second nozzle movement unit 26, the third nozzle movement unit 29 and the like. The control device 3 further controls the opening and closing operation and the like of the chemical liquid valve 19, the rinse liquid valve 24, the first gas valve 41, the second gas valve 43 and the like.

Figure 6A:
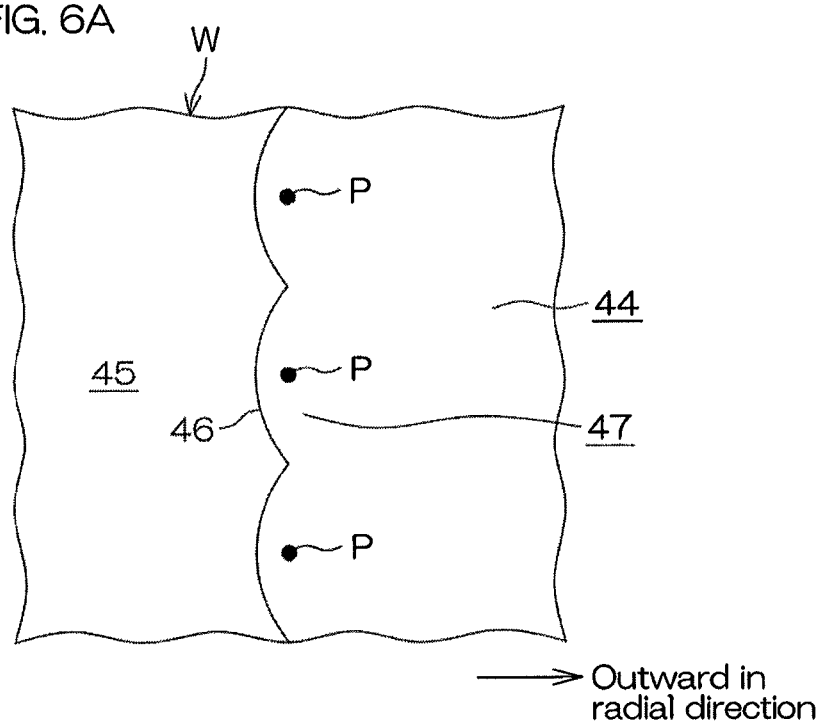
FIGS. 6A and 6B are plan views showing a state of a boundary portion of a liquid film of a rinse liquid when a liquid film removal region is enlarged.
Figure 6B:
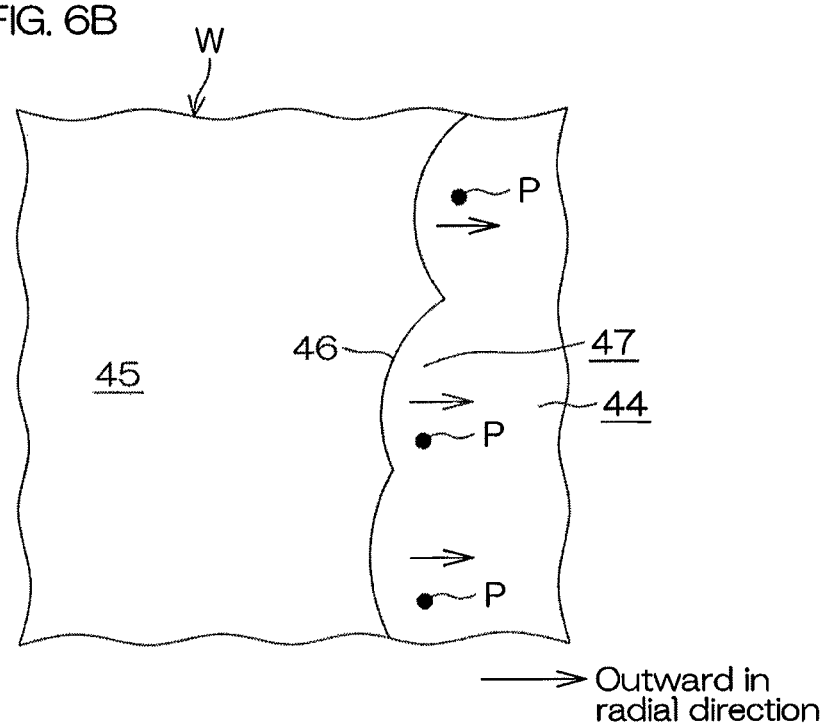

FIG. 3 is a flowchart for illustrating a first processing example of the processing performed by the substrate processing apparatus 1. FIGS. 4A to 4F are schematic diagrams for illustrating the first processing example. FIG. 5 is a graph showing a relationship between a processing time and the flow rate of discharge of the mixture gas (IPA Vapor+$N_2$) from the first discharge port 35 and the second discharge port 39. FIGS. 6A and 6B are plan views showing a state of a boundary portion 47 of the liquid film of the rinse liquid when a liquid film removal region 45 is enlarged.

The first processing example will be described with reference to FIGS. 1 to 3. FIGS. 4A to 4F, FIG. 5 and FIGS. 6A and 6B will be referenced as necessary. The first processing example is a processing example in which the chemical liquid is used to perform washing processing on the upper surface of the substrate W.

When the substrate processing apparatus 1 processes the substrate W, an unprocessed substrate W is fed into the chamber 4 (step S1). Specifically, in a state where the nozzles 17, 22, 27 and the like within the chamber 4 are retracted from above the spin chuck 5, the control device 3 makes a transfer robot (not shown) feed the substrate W into the chamber 4. Then, in a state where the target surface (for example, a pattern formation surface) of the substrate W to be processed is faced upward, the control device 3 makes the transfer robot place the substrate W on the spin chuck 5 (substrate holding step). Thereafter, the control device 3 rotates the spin motor 13 in a state where the substrate W is held by the spin chuck 5. In this way, the rotation of the substrate W is started (step S2). The control device 3 retracts the transfer robot from the interior of the chamber 4 after the substrate W is placed on the spin chuck 5.

Next, a chemical liquid step (step S3) that supplies the chemical liquid to the substrate W is performed. Specifically, the control device 3 controls the first nozzle movement unit 21 to move the chemical liquid nozzle 17 from the retraction position to the processing position. Thereafter, the control device 3 opens the chemical liquid valve 19 to discharge the chemical liquid from the chemical liquid nozzle 17 toward the upper surface of the substrate W being rotated. The chemical liquid discharged from the chemical liquid nozzle 17 is supplied to the upper surface of the substrate W, and is then made to flow by a centrifugal force outward along the upper surface of the substrate W. Furthermore, the control device 3 moves the supply position of the chemical liquid with respect to the upper surface of the substrate W between the center portion and the circumferential edge portion in a state where the substrate W is rotated. In this way, the supply position of the chemical liquid scans the entire region of the upper surface of the substrate W and thus the entire region of the upper surface of the substrate W is uniformly processed. When a predetermined time has elapsed, the control device 3 closes the chemical liquid valve 19 to stop the discharge of the chemical liquid from the chemical liquid nozzle 17 and thereafter controls the second nozzle movement unit 2 to retract the chemical liquid nozzle 17 from above the spin chuck 5. In the chemical liquid step (S3), the particles are removed from the upper surface of the substrate W fed into the chamber 4.

In the chemical liquid step (S3), physical washing may be performed. As the physical washing, droplet discharge washing in which a jet of small liquid droplets of the chemical liquid from a so-called two-fluid nozzle is supplied to the upper surface of the substrate W and brush washing in which while the chemical liquid is being supplied to the surface of the substrate W, a brush such as a scrub brush is brought into contact with the front surface of the substrate W to wash the front surface can be illustrated.

Next, a rinse step (step S4) of supplying the rinse liquid to the substrate W is performed. Specifically, the control device 3 controls the second nozzle movement unit 26 to move the rinse liquid nozzle 22 from the retraction position to the processing position. Thereafter, the control device 3 opens the rinse liquid valve 24 to discharge the water from the rinse liquid nozzle 22 toward the upper surface of the substrate W being rotated. As with the chemical liquid discharged from the chemical liquid nozzle 17, the rinse liquid discharged from the rinse liquid nozzle 22 reaches the upper surface of the substrate W, and is then made to flow by a centrifugal force outward along the upper surface of the substrate W. Hence, the chemical liquid on the substrate W is washed outward by the rinse liquid and is exhausted to the surrounding area of the substrate W. In this way, the chemical liquid on the substrate W is washed out by the rinse liquid. Furthermore, the control device 3 moves the supply position of the rinse liquid with respect to the upper surface of the substrate W between the center portion and the circumferential edge portion in a state where the substrate W is rotated. In this way, the supply position of the rinse liquid scans the entire region of the upper surface of the substrate W and thus the rinse processing is performed on the entire region of the upper surface of the substrate W. The rinse liquid contains the particles removed from the upper surface of the substrate W.

Figure 4A:
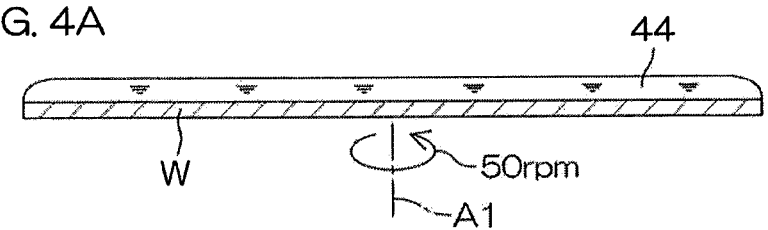
FIGS. 4A to 4F are schematic diagrams for illustrating the first processing example.

Next, a paddle rinse step (step S5) of holding the liquid film of the rinse liquid (the liquid film of the processing liquid) on the substrate W in a state where the supply of the rinse liquid to the substrate W is stopped is performed. Specifically, the control device 3 controls the spin chuck 5 to stop the rotation of the substrate W in a state where the entire region of the upper surface of the substrate W is covered by the rinse liquid or the rotation speed of the substrate W is lowered to a low rotation speed (for example, about 10 to 100 rpm) lower than the rotation speed in the rinse step (S4) (FIG. 4A shows a state where the substrate W is rotated at a low speed of about 50 rpm). In this way, on the upper surface of the substrate W, the liquid film 44 of the rinse liquid in the shape of a paddle is formed so as to cover the entire region of the upper surface of the substrate W. In this state, a centrifugal force applied to the liquid film 44 of the rinse liquid on the upper surface of the substrate W is lower than a surface tension applied between the rinse liquid and the upper surface of the substrate W or the centrifugal force is substantially equal to the surface tension. The substrate W is decreased in speed and thus the centrifugal force applied to the rinse liquid on the substrate W is reduced, with the result that the amount of rinse liquid exhausted from on the substrate W is reduced. The particles may be contained in the liquid film 44 of the rinse liquid.

In a state where the substrate W remains stationary or the substrate W is rotated at a lower rotation speed, the control device 3 closes the rinse liquid valve 24 to stop the discharge of the rinse liquid from the rinse liquid nozzle 22. After the formation of the liquid film 44 of the rinse liquid in the shape of a paddle on the upper surface of the substrate W, the supply of the rinse liquid to the upper surface of the substrate W may be continued.

Next, the control device 3 performs a drying step (step S6).

Specifically, the control device 3 controls the third nozzle movement unit 29 to move the gas nozzle 27 from the retraction position to the center position. After the gas nozzle 27 is arranged in the center position, the mixture gas (IPA Vapor+$N_2$) is discharged from the gas nozzle 27.

Figure 4B:
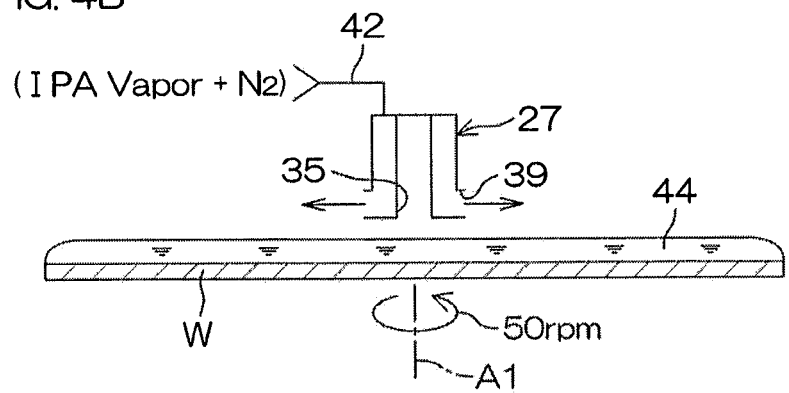

Specifically, the control device 3 first opens the second gas valve 43 to discharge, as shown in FIG. 4B, the mixture gas (IPA Vapor+$N_2$) from the second discharge port 39 of the gas nozzle 27 radially in the horizontal direction. In this way, the mixture gas (IPA Vapor+$N_2$) is supplied to the surrounding area of the center portion of the liquid film 44 of the rinse liquid on the substrate W, and thus the surrounding area of the center portion is brought into a state where the vapor of the IPA is rich.

As shown in FIG. 5, after the start of the discharge of the mixture gas (IPA Vapor+$N_2$), the control device 3 gradually increases the flow rate of the discharge of the mixture gas (IPA Vapor+$N_2$) from the second discharge port 39. Although in FIG. 5, the flow rate of the discharge of the mixture gas (IPA Vapor+$N_2$) proportionally increases with time, if it increases with time, it does not need to proportionally increase with time.

Figure 4C:
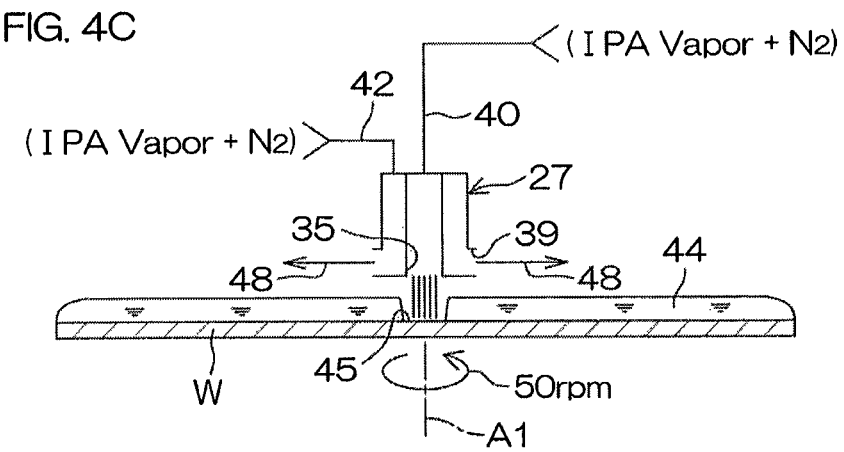

When a predetermined period has elapsed since the start of the discharge of the mixture gas (IPA Vapor+$N_2$) from the second discharge port 39, the control device 3 then opens the first gas valve 41 to discharge the mixture gas (IPA Vapor+$N_2$) downward from the first discharge port 35 of the gas nozzle 27, and thus as shown in FIG. 4C, the mixture gas (IPA Vapor+$N_2$) is blown to the center portion of the liquid film 44 of the rinse liquid on the upper surface of the substrate W. In this way, the rinse liquid in the center portion of the liquid film 44 of the rinse liquid is physically extended by being pushed through the blowing pressure (gas pressure), and is removed by being blown from the center portion of the upper surface of the substrate W. Consequently, the liquid film removal region 45 is formed in the center portion of the upper surface of the substrate W.

The mixture gas (IPA Vapor+$N_2$) discharged from the first discharge port 35 is passed through the space SP between the upper surface of the substrate W and the lower surface 33c of the flange 33, and is discharged radially in the horizontal direction from the annular port 50 formed between the outer circumferential end 33a of the flange 33 and the substrate W. Hence, after the formation of the liquid film removal region 45, the mixture gas (IPA Vapor+$N_2$) from the annular port 50 flows radially and outward in the circumferential direction along the upper surface of the substrate W.

As shown in FIG. 5, after the start of the discharge of the mixture gas (IPA Vapor+$N_2$), the control device 3 gradually increases the flow rate of the discharge of the mixture gas (IPA Vapor+$N_2$) from the first discharge port 35. Although in FIG. 5, the flow rate of the discharge of the mixture gas (IPA Vapor+$N_2$) proportionally increases with time, if it increases with time, it does not need to proportionally increase with time.

Figure 4D:
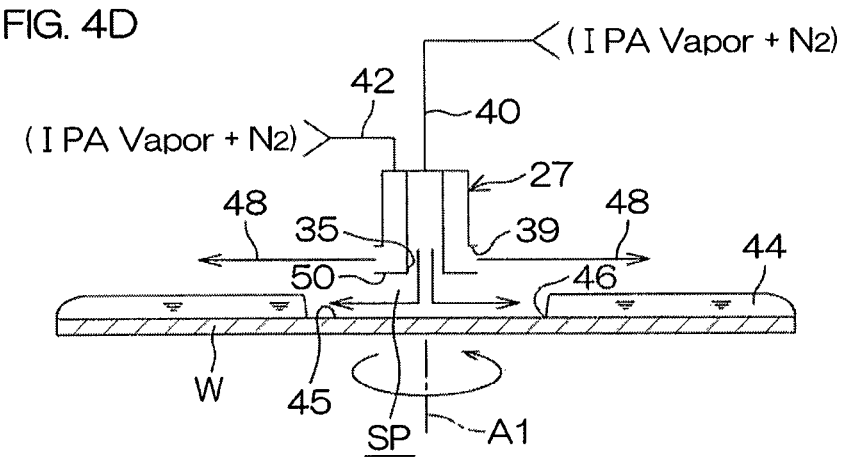
Figure 4E:
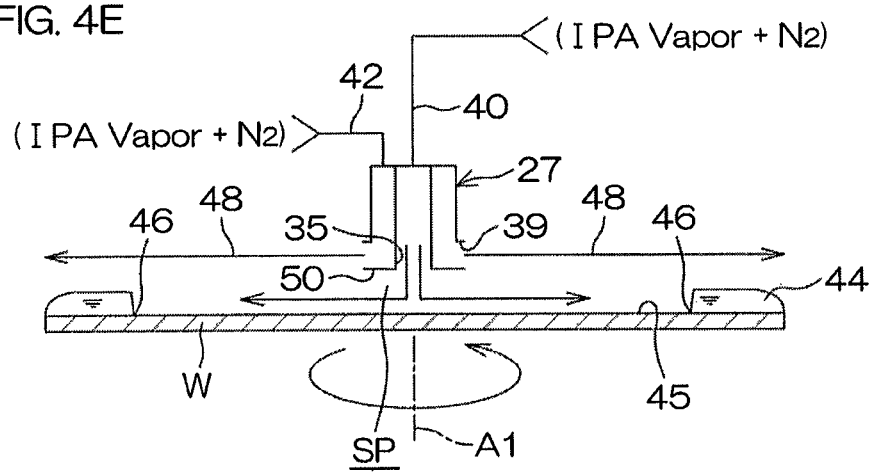

After the start of the discharge of the mixture gas (IPA Vapor+$N_2$) from the first discharge port 35, the control device 3 controls the spin motor 13 to gradually increase the rotation speed of the substrate W from zero or the lower rotation speed. When the rotation speed of the substrate W exceeds a predetermined speed, the centrifugal force produced by the rotation of the substrate W is applied to the liquid film 44 of the rinse liquid on the substrate W. As the rotation speed of the substrate W is increased, the centrifugal force is increased. As the flow rate of the discharge of the mixture gas (IPA Vapor+$N_2$) is increased, and the rotation speed of the substrate W is increased, as shown in FIG. 4D, the liquid film removal region 45 is enlarged. The acceleration of the rotation of the substrate W may be started not after the start of the discharge of the mixture gas (IPA Vapor+$N_2$) from the first discharge port 35 but at the same time when the discharge of the mixture gas (IPA Vapor+$N_2$) from the first discharge port 35 is started.

The liquid film removal region 45 is enlarged, and thus a boundary 46 between the upper surface of the substrate and the liquid film of the rinse liquid is moved outward of the substrate W. Due to the following two reasons, regardless of the conditions of the enlargement of the liquid film removal region 45, the ambient atmosphere of the boundary 46 can be kept in a state where the vapor of the IPA is rich.

The first reason is that since the flow rate of the discharge of the mixture gas (IPA Vapor+$N_2$) from the second discharge port 39 is gradually increased after the start of the discharge, the mixture gas (IPA Vapor+$N_2$) discharged radially from the second discharge port 39 is constantly supplied to the surrounding area of the boundary 46.

The second reason is as follows. Specifically, since the second discharge port 39 is arranged higher than the first discharge port 35, the flow 48 (see FIG. 2) of the mixture gas (IPA Vapor+$N_2$) discharged from the second discharge port 39 interrupts the surrounding area of the boundary 46 from a region higher than the second discharge port 39. Moreover, the mixture gas (IPA Vapor+$N_2$) from the first discharge port 35 is discharged from the annular port 50 radially in the horizontal direction, and the mixture gas (IPA Vapor+$N_2$) flows along the upper surface of the substrate W outward in the circumferential direction and the mixture gas (IPA Vapor+$N_2$) from the first discharge port 35 is kept stationary in a position in the vicinity of the upper surface of the substrate W by the flow 48 (see FIG. 2) of the mixture gas (IPA Vapor+$N_2$) from the second discharge port 39.

When the ambient atmosphere of the boundary 46 is in a state where the vapor of the IPA having a lower surface tension than that of the rinse liquid is rich, as shown in FIG. 2, no thermal convection is generated within a portion (referred to as the "boundary portion 47 of the liquid film of the rinse liquid") of the liquid film 44 of the rinse liquid near the boundary with the upper surface of the substrate, and moreover, Marangoni convection 49 flowing in a direction (that is, a direction opposite to the thermal convection) apart from the boundary 46 is generated within the boundary portion 47 of the liquid film of the rinse liquid. After the formation of the liquid film removal region 45, regardless of the conditions of the enlargement of the liquid film removal region 45, the ambient atmosphere of the boundary 46 can be kept in a state where the vapor of the IPA is rich.

FIGS. 6A and 6B are plan views showing a state of the boundary portion 47 of the liquid film of the rinse liquid when the liquid film removal region 45 is enlarged.

As shown in FIG. 6A, when the particles P contained in the liquid film 44 of the rinse liquid are present in the boundary portion 47 of the liquid film of the rinse liquid, the particles P are induced by the Marangoni convection 49 in a direction apart from the boundary 46. Hence, as the liquid film removal region 45 is enlarged, the boundary 46 is moved outward of the substrate W, and accordingly, as shown in FIG. 6B, the particles P are moved outward in the radial direction. Hence, the liquid film removal region 45 is enlarged in a state where the particles P are kept in the boundary portion 47 of the liquid film of the rinse liquid.

Then, the liquid film removal region 45 is enlarged over the entire region of the substrate W, the liquid film 44 of the rinse liquid is completely exhausted from the upper surface of the substrate W (the state shown in FIG. 4F) and thus the entire region of the upper surface of the substrate W is dried. The particles contained in the liquid film 44 of the rinse liquid are removed from the upper surface of the substrate W together with the liquid film 44 of the rinse liquid without appearing in the liquid film removal region 45.

After the liquid film removal region 45 is enlarged over the entire region of the upper surface of the substrate W, the control device 3 closes the first gas valve 41 and the second gas valve 43 to stop the discharge of the mixture gas (IPA Vapor+$N_2$) from the gas nozzle 27. Thereafter, the control device 3 controls the third nozzle movement unit 29 to retract the gas nozzle 27 from above the spin chuck 5. The control device 3 also controls the spin motor 13 to stop the rotation (the rotation of the substrate W) of the spin chuck 5 (step S7).

In this way, the processing on one substrate W is completed, and the control device 3 feeds the processed substrate W out of the chamber 4 with the transfer robot as the substrate W is fed thereinto (step S8).

As described above, according to this preferred embodiment, the mixture gas (IPA Vapor+$N_2$) is blown to the liquid film 44 of the rinse liquid formed on the upper surface of the substrate W from above the upper surface of the substrate W, and thus the liquid film removal region 45 is formed on the liquid film 44 of the rinse liquid. The liquid film removal region 45 is enlarged, and thus the boundary 46 is moved outward of the substrate W. The liquid film removal region 45 is enlarged over the entire region of the substrate W, and thus the entire region of the upper surface of the substrate W is dried.

The mixture gas (IPA Vapor+$N_2$) is discharged from the annular second discharge port 39 radially in the horizontal direction. The mixture gas (IPA Vapor+$N_2$) discharged from the second discharge port 39 is supplied to the surrounding area of the liquid film 44 of the rinse liquid formed on the upper surface of the substrate W. Hence, the atmosphere in the vicinity of the upper surface of the liquid film 44 of the rinse liquid can be kept in the state where the vapor of the IPA is rich. Thus, after the formation of the liquid film removal region 45, the ambient atmosphere of the boundary 46 can be kept in the state where the vapor of the IPA is rich. In this way, it is possible to generate, within the boundary portion 47 of the liquid film of the rinse liquid, the Marangoni convection 49 in the direction apart from the boundary 46, with the result that it is possible to maintain the generated Marangoni convection 49.

Hence, when the particles are contained in the liquid film 44 of the rinse liquid, the particles are induced by the Marangoni convection 49 in the direction apart from the boundary 46. When the liquid film removal region 45 is enlarged, the ambient atmosphere of the boundary 46 can be kept in the state where the vapor of the IPA is rich. Thus, the liquid film removal region 45 can be enlarged in the state where the particles in the liquid film 44 of the rinse liquid are kept in the boundary portion 47 of the liquid film of the rinse liquid. Hence, the particles contained in the liquid film 44 of the rinse liquid are removed from the upper surface of the substrate W together with the liquid film 44 of the rinse liquid without appearing in the liquid film removal region 45. Therefore, after the drying of the substrate W, the particles are prevented from being left on the upper surface of the substrate W. In this way, it is possible to dry the entire region of the upper surface of the substrate W while reducing or preventing both particle generation and water mark generation.

Since the discharge of the mixture gas (IPA Vapor+$N_2$) from the second discharge port 39 is started before the start of the discharge of the mixture gas (IPA Vapor+$N_2$) from the first discharge port 35, the formation of the liquid film removal region 45 can be started with the atmosphere in the vicinity of the upper surface of the substrate W in the state where the vapor of the IPA is rich. In this way, it is possible to generate, within the boundary portion 47 of the liquid film of the rinse liquid, the Marangoni convection 49 flowing in the direction apart from the boundary 46 when the formation of the liquid film removal region 45 is started.

Moreover, since the second discharge port 39 is arranged higher than the first discharge port 35, the flow of the mixture gas (IPA Vapor+$N_2$) discharged from the second discharge port 39 interrupts the surrounding area of the boundary 46 from the region higher than the second discharge port 39. In this way, it is possible to keep the surrounding area of the boundary 46 in a state where the vapor of the IPA is richer.

The mixture gas (IPA Vapor+$N_2$) discharged from the first discharge port 35 is passed through the space SP between the upper surface of the substrate W and the flange 33, and is discharged radially in the horizontal direction from the annular port 50 formed between the outer circumferential end 33a of the flange 33 and the substrate W. Hence, after the formation of the liquid film removal region 45, the mixture gas (IPA Vapor+$N_2$) flows outward in the circumferential direction along the upper surface of the substrate W. In this way, it is possible to keep the surrounding area of the boundary 46 in a state where the vapor of the IPA is much richer.

Since the flow rate of the discharge of the mixture gas (IPA Vapor+$N_2$) from the second discharge port 39 is gradually increased after the start of the discharge, regardless of the conditions of the enlargement of the liquid film removal region 45, the ambient atmosphere of the boundary 46 can be kept in the state where the vapor of the IPA is rich.

For example, it can be considered that while the entire region of the interior of the chamber 4 is being filled with the atmosphere of the vapor of the IPA, the vapor of the IPA is blown to the liquid film 44 of the rinse liquid. However, in this case, it is necessary to fill the entire region of the interior of the chamber 4 with the atmosphere of the vapor of the IPA, and thus the amount of IPA consumed is significantly increased.

By contrast, in this preferred embodiment, the mixture gas (IPA Vapor+$N_2$) is discharged from the second discharge port 39 radially in the horizontal direction, and thus the ambient atmosphere of the boundary 46 can be kept in the state where the vapor of the IPA is rich. In this way, it is possible to satisfactorily dry the upper surface of the substrate W while reducing the IPA.

Figure 7:
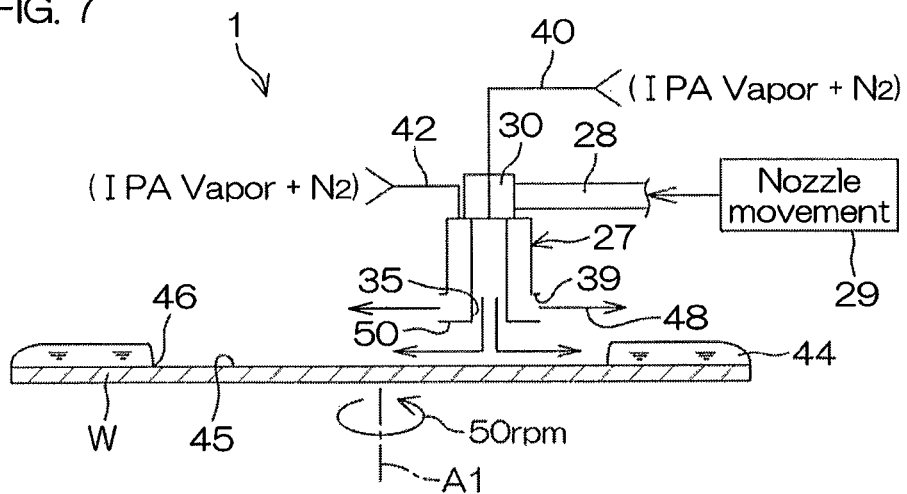
FIG. 7 is a schematic diagram for illustrating a second processing example of the processing performed by the substrate processing apparatus.

FIG. 7 is a schematic diagram for illustrating a second processing example of the processing performed by the substrate processing apparatus 1.

Figure 4F:
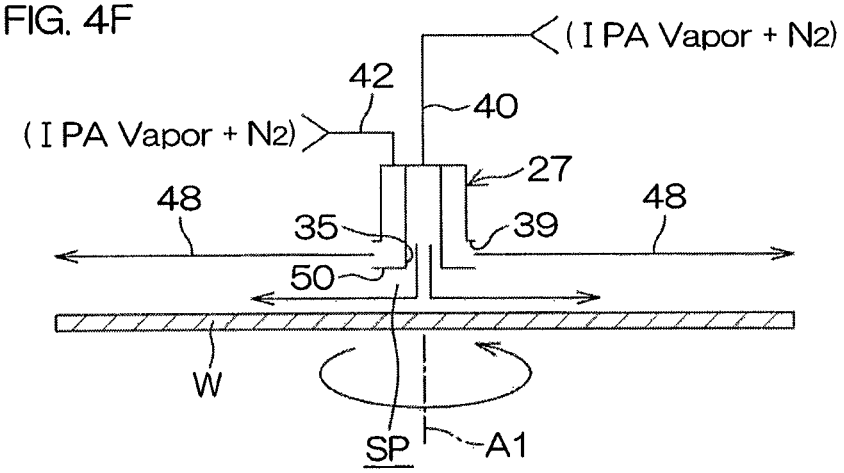

The second processing example differs from the first processing example shown in FIGS. 3 to 4F in that in the drying step (S6), after the start of the blowing of the mixture gas (IPA Vapor+$N_2$) from the first discharge port 35 to the upper surface of the substrate W (that is, after the formation of the liquid film removal region 45), the position of the upper surface of the substrate W to which the mixture gas (IPA Vapor+$N_2$) is blown is moved from the center portion of the upper surface of the substrate W to the circumferential edge portion of the upper surface, and thus the liquid film removal region 45 is enlarged. The second processing example is the same as the first processing example except that point.

Specifically, after the formation of the liquid film removal region 45, while continuing the blowing of the mixture gas (IPA Vapor+$N_2$) from the first discharge port 35 of the gas nozzle 27, the control device 3 controls the third nozzle movement unit 29 to move the gas nozzle 27 from above the center portion of the upper surface of the substrate W to above the circumferential edge portion of the upper surface outward and horizontally in the radial direction. In this way, the liquid film removal region 45 is enlarged.

In the second processing example, it is possible to realize the enlargement of the liquid film removal region 45 by moving the position to which the mixture gas (IPA Vapor+$N_2$) from the first discharge port 35 is blown outward in the radial direction. Hence, the flow rate of the discharge of the mixture gas (IPA Vapor+$N_2$) from the first discharge port 35 may be kept constant after the start of the discharge. The rotation speed of the substrate W may be maintained to be zero or the low rotation speed (FIG. 7 shows a case where the substrate W is rotated at 50 rpm).

The flow rate of the discharge of the mixture gas (IPA Vapor+$N_2$) from the second discharge port 39 is kept constant after the start of the discharge.

The liquid film removal region 45 is enlarged, and thus the boundary 46 is moved outward of the substrate W. The boundary 46 is moved following the movement of the position to which the mixture gas from the first discharge port 35 is blown, that is, the boundary 46 is moved following the movement of the gas nozzle 27. Hence, regardless of the conditions of the enlargement of the liquid film removal region 45, the mixture gas (IPA Vapor+$N_2$) discharged radially from the second discharge port 39 can be constantly supplied to the surrounding area of the boundary 46. In this way, regardless of the conditions of the enlargement of the liquid film removal region 45, the ambient atmosphere of the boundary 46 can be kept in the state where the vapor of the IPA is rich.

As described above, in the second processing example, the actions and effects equivalent to those described in the first processing example are achieved.

In the second processing example, the flow rate of the discharge of the mixture gas (IPA Vapor+$N_2$) from the second discharge port 39 may be gradually increased after the start of the discharge as in the first processing example.

In the second processing example, the flow rate of the discharge of the mixture gas (IPA Vapor+$N_2$) from the first discharge port 35 may be gradually increased after the start of the discharge as in the first processing example. The rotation speed of the substrate W may also be gradually increased after the start of the discharge as in the first processing example.

Figure 8:
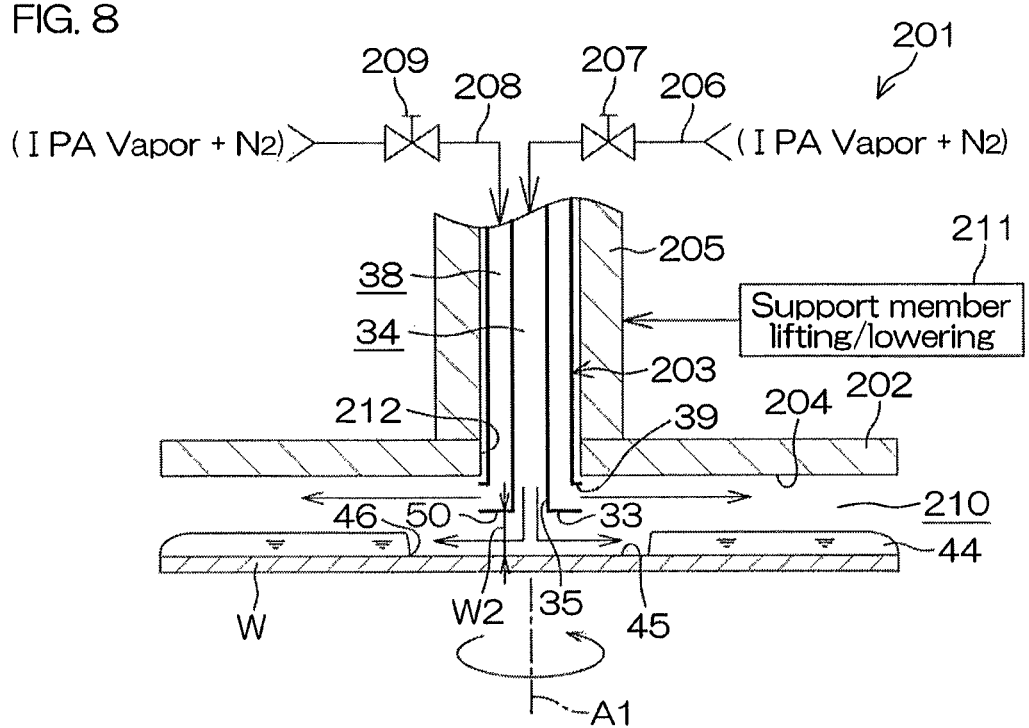
FIG. 8 is a schematic diagram for illustrating the configuration of a substrate processing apparatus according to a second preferred embodiment of the present invention.

FIG. 8 is a schematic diagram for illustrating the configuration of a substrate processing apparatus 201 according to a second preferred embodiment of the present invention.

In the second preferred embodiment, the same portions as in the first preferred embodiment are identified with the same reference symbols as in FIGS. 1 to 7, and the description thereof will be omitted. The substrate processing apparatus 201 according to the second preferred embodiment mainly differs from the substrate processing apparatus 1 according to the first preferred embodiment in that an opposite member 202 opposite to the upper surface of the substrate W held by the spin chuck 5 is provided.

The opposite member 202 is formed in the shape of a disc. The diameter of the opposite member 202 is equal to or more than that of the substrate W. On the lower surface of the opposite member 202, a circular opposite surface 204 is formed that is opposite to the upper surface of the substrate W held by the spin chuck 5 and that is formed with a flat surface. The opposite surface 204 is opposite to the entire region of the upper surface of the substrate W. The opposite member 202 is supported by a holder 205 in a horizontal position such that the center axis of the opposite member 202 is located on the rotation axis A1 of the spin chuck 5.

On the upper surface of the opposite member 202, the holder 205 is fixed in which a vertical axis (vertical axis that coincides with the rotation axis A1 of the spin chuck 5) passing through the center of the opposite member 202 is the center axis. The holder 205 is formed so as to be hollow, and a gas nozzle (nozzle) 203 is inserted thereinto in a state where the gas nozzle 203 is extended in the vertical direction. The gas nozzle 203 is protruded below the opposite surface 204 through a through hole 212 formed in the center portion of the opposite member 202. The gas nozzle 203 is located with respect to the opposite member 202 such that the first and second discharge ports 35 and 39 are exposed below the opposite surface 204. More specifically, a small gap is formed between the opposite surface 204 and the upper end of the second discharge port 39.

A third gas pipe 206 is connected to the first gas flow path 34 of the gas nozzle 203. A third gas valve 207 is interposed in the third gas pipe 206. A fourth gas pipe 208 is connected to the second gas flow path 38 of the gas nozzle 203. A fourth gas valve 209 is interposed in the fourth gas pipe 208. When the third gas valve 207 is opened, the mixture gas (IPA Vapor+$N_2$) supplied from the third gas pipe 206 to the first gas flow path 34 of the gas nozzle 203 is discharged downward from the first discharge port 35. When the fourth gas valve 209 is opened, the mixture gas (IPA Vapor+$N_2$) supplied from the fourth gas pipe 208 to the second gas flow path 38 of the gas nozzle 203 is discharged from the second discharge port 39 radially in the horizontal direction.

A support member lifting/lowering unit 211 is coupled to the holder 205. The control device 3 controls the support member lifting/lowering unit 211 such that the support member lifting/lowering unit 211 is lifted and lowered between a close position where the opposite surface 204 of the opposite member 202 is close to the upper surface of the substrate W held by the spin chuck 5 and a retraction position where the opposite surface 204 of the opposite member 202 is significantly retracted above the spin chuck 5. When the opposite member 202 is located in the close position, the lower surface 33c (see FIG. 2) of the flange 33 of the gas nozzle 203 is opposite to the upper surface of the substrate W with a predetermined space W2 (for example, about 6 mm) apart.

The control device 3 controls the operations of the support member lifting/lowering unit 211 and the like according to a predetermined program. The control device 3 further controls the opening and closing operation and the like of the third gas valve 207, the fourth gas valve 209 and the like.

In the substrate processing apparatus 201 according to the second preferred embodiment, for example, processing equivalent to the first processing example (see FIGS. 3 and 4A to 4F) is performed. In the drying step (step S6 of FIG. 3), the control device 3 controls the support member lifting/lowering unit 211 to locate the opposite member 202 in the close position. Thereafter, the discharge of the mixture gas (IPA Vapor+$N_2$) from the gas nozzle 203 is performed. The timing at which the mixture gas (IPA Vapor+$N_2$) from the first and second discharge ports 35 and 39 of the gas nozzle 203 is discharged, the flow rate of the discharge and the rotation of the substrate W are equivalent to those in the first processing example of the first preferred embodiment. Hence, in the second preferred embodiment, the effects equivalent to those described in the first preferred embodiment are achieved.

In the second preferred embodiment, in addition to the actions and effects described in the first preferred embodiment, a space 210 between the opposite surface 204 and the upper surface of the substrate W is filled with the mixture gas (IPA Vapor+$N_2$) discharged from the second discharge port 39. Hence, it is possible to reduce the flowing of the mixture gas (IPA Vapor+$N_2$) out from near the upper surface of the substrate W. In this way, the ambient atmosphere of the boundary 46 can be kept in the state where the vapor of the IPA is richer.

Figure 9:
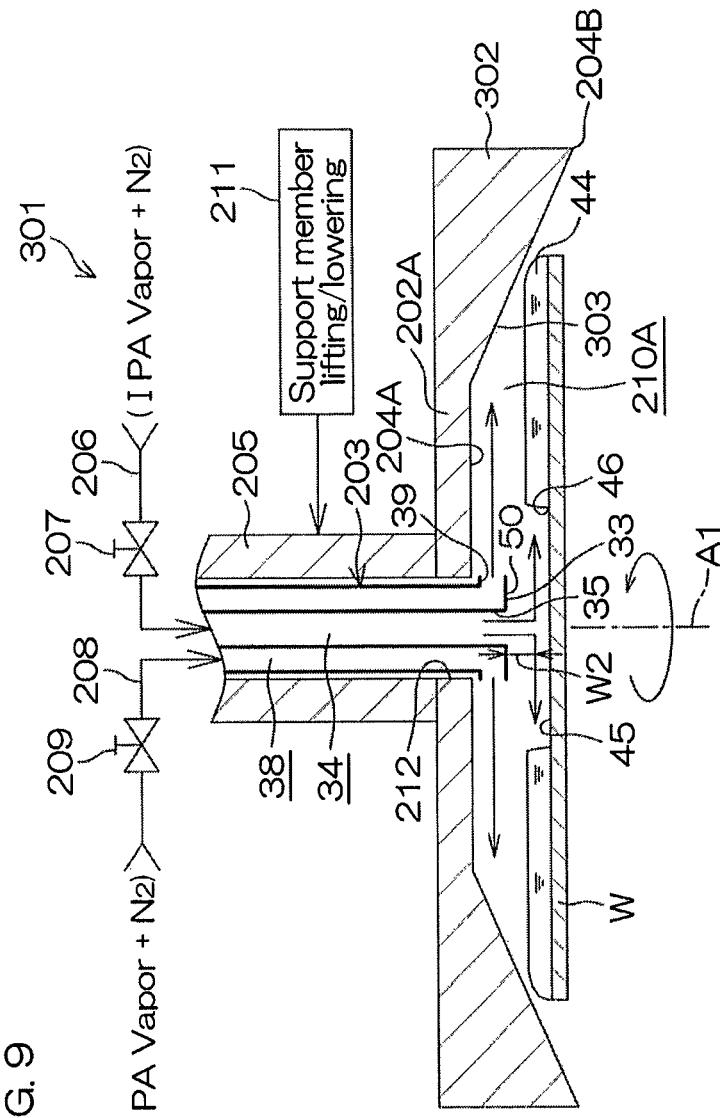
FIG. 9 is a schematic diagram for illustrating the configuration of a substrate processing apparatus according to a third preferred embodiment of the present invention.

FIG. 9 is a schematic diagram for illustrating the configuration of a substrate processing apparatus 301 according to a third preferred embodiment of the present invention.

In the third preferred embodiment, the same portions as in the second preferred embodiment are identified with the same reference symbols as in FIG. 8, and the description thereof will be omitted. The substrate processing apparatus 301 according to the third preferred embodiment mainly differs from the substrate processing apparatus 201 according to the second preferred embodiment in that instead of the opposite member 202, an opposite member 202A is provided.

The opposite member 202A is formed in the shape of a disc. The diameter of the opposite member 202A may be equal to the diameter of the substrate W, and may be more than the diameter of the substrate W as shown in FIG. 9. On the lower surface of the opposite member 202A, an opposite surface 204A opposite to the upper surface of the substrate W held by the spin chuck 5 is formed. The center portion of the opposite surface 204A is formed in a horizontally flat shape. On the circumferential edge portion of the opposite surface 204A, an annular protrusion portion (opposite circumferential edge portion) 302 is formed. On the lower surface of the annular protrusion portion 302, a taper surface 303 is formed that is lowered as it is extended outward in the radial direction. As shown in FIG. 9, when the diameter of the opposite member 202A is more than that of the substrate W, the circumferential end edge of the opposite member 202A is extended, in a plan view, outward of the circumferential end edge of the substrate W.

The control device 3 controls the support member lifting/lowering unit 211 such that the support member lifting/lowering unit 211 is lifted and lowered between a close position where the opposite surface 204A of the opposite member 202A is close to the upper surface of the substrate W held by the spin chuck 5 and a retraction position where the opposite surface 204A of the opposite member 202A is significantly retracted above the spin chuck 5. When the opposite member 202A is located in the close position, the lower surface 33c (see FIG. 2) of the flange 33 of the gas nozzle 203 is opposite to the upper surface of the substrate W with the predetermined space W2 (for example, about 6 mm) apart. In this state, as shown in FIG. 9, the outer circumferential end 303a of the taper surface 303 is located lower in the up/down direction than the upper surface of the substrate W. Hence, a space partitioned by the opposite surface 204A and the upper surface of the substrate W forms a hermetically sealed space that is substantially hermetically sealed from its external space. Then, a space between the circumferential edge portion of the upper surface of the substrate W and the annular protrusion portion 302 (that is, the taper surface 303) is set significantly narrower than a space between the center portion of the opposite surface 204A and the center portion of the upper surface of the substrate W.

In the substrate processing apparatus 301 according to the third preferred embodiment, processing equivalent to the case of the substrate processing apparatus 201 according to the second preferred embodiment is performed. In other words, in the drying step (step S6 of FIG. 3), the control device 3 controls the support member lifting/lowering unit 211 to locate the opposite member 202A in the close position.

In the third preferred embodiment, in addition to the actions and effects described in the second preferred embodiment, the space partitioned by the opposite surface 204A and the upper surface of the substrate W is substantially hermetically sealed from its external space, and thus it is difficult for the mixture gas (IPA Vapor+$N_2$) supplied to a space 210A between the opposite surface 204A and the upper surface of the substrate W to be exhausted from the space 210A. Hence, it is possible to further reduce the flowing of the mixture gas (IPA Vapor+$N_2$) out from near the upper surface of the substrate W. In this way, the ambient atmosphere of the boundary 46 can be kept in the state where the vapor of the IPA is much richer.

Although the three preferred embodiments of this invention are described above, this invention can be practiced with still other preferred embodiments.

For example, although in the first process example (as in the processing examples of the second and third preferred embodiments) of the first preferred embodiment, the description is given using, as an example, the case where the liquid film removal region 45 is enlarged by the increase in the flow rate of the mixture gas (IPA Vapor+$N_2$) and the increase in the rotation speed of the substrate W, the enlargement of the liquid film removal region 45 may be achieved by only one of the increase in the flow rate of the mixture gas (IPA Vapor+$N_2$) and the increase in the rotation speed of the substrate W.

Although in the description of the preferred embodiments described above, the discharge of the mixture gas (IPA Vapor+$N_2$) from the second discharge port 39 is started before the start of the discharge of the mixture gas (IPA Vapor+$N_2$) from the first discharge port 35, the timing at which the discharge of the mixture gas (IPA Vapor+$N_2$) from the first discharge port 35 is started may be the same as the timing at which the discharge of the mixture gas (IPA Vapor+$N_2$) from the second discharge port 39 is started.

Although in the description of the preferred embodiments described above, the gas discharged from the first and second discharge ports 35 and 39 is the mixture gas (IPA Vapor+$N_2$), as the gas discharged from the first and second discharge ports 35 and 39, the vapor (the vapor of a low surface tension liquid) of the IPA that does not include $N_2$ gas may be adopted.

Although in the description, as the example of the low surface tension liquid, the IPA which is an organic solvent having a lower surface tension than that of the rinse liquid is used, such an organic solvent, in addition to the IPA, for example, methanol, ethanol, acetone, HFE (hydrofluoroether) and the like can be adopted.

Although in the description of the preferred embodiments described above, the case where the processing liquid of the liquid film 44 is the rinse liquid is used, the processing liquid of the liquid film may be the IPA (liquid). In this case, the vapor of the low surface tension liquid included in the gas discharged from the first and second discharge ports 35 and 39 may be HFE or EG (ethylene glycol).

Although in the description, the gas nozzles 27 and 203 have the configuration in which the annular port 50 and the annular second discharge port 39 are divided by the flange 33 into the upper and lower portions, there is no limitation to such a configuration, and as a matter of course, a nozzle shape having another configuration may be adopted.

The type of gas (first gas) discharged from the first discharge port 35 and the type of gas (second gas) discharged from the second discharge port 39 may be different from each other.

Although in the description of the preferred embodiments described above, the case where the substrate processing apparatuss 1, 201 and 301 process the substrate W in the shape of a disc is used, the substrate processing apparatuss 1, 201 and 301 may process a polygonal substrate such as a liquid crystal display device glass substrate.

Although the preferred embodiments of the present invention are described in details above, they are simply specific examples that are used so as to clarify the technical details of the present invention, the present invention should not be interpreted by being limited to these specific examples and the scope of the present invention is limited only by the scope of claims attached.

This application corresponds to Japanese Patent Application No. 2015-43708 filed with Japan Patent Office on Mar. 5, 2015, and the entire disclosure of this application is incorporated herein by reference.

What is claimed is:
1. A substrate processing method comprising:
a substrate holding step of holding a substrate horizontally;
a liquid film formation step of supplying a processing liquid to an upper surface of the substrate to form a liquid film of the processing liquid covering the upper surface of the substrate;
a step of stopping the supplying of the processing liquid to the upper surface of the substrate after the liquid film formation step, and stationarily placing a nozzle above a center of the substrate, the nozzle including a first discharge port which discharges a gas downward and an annular second discharge port which discharges a gas laterally, the second discharge port being arranged higher than the first discharge port with respect to a vertical direction;
a first gas discharge step of discharging, in a direction intersecting the upper surface, a first gas containing a vapor of a low surface tension liquid having a lower surface tension than the processing liquid from the first discharge port of the nozzle that is stationarily placed above the center of the substrate and spraying, to the liquid film of the processing liquid, the first gas along the direction intersecting the upper surface so as to form a liquid film removal region where the liquid film is removed from the liquid film of the processing liquid;
a second gas discharge step of laterally discharging a second gas containing a vapor of a low surface tension liquid having a lower surface tension than the processing liquid radially around the center of the substrate in a horizontal direction from the second discharge port of the nozzle that is stationarily placed above the center of the substrate; and a liquid film removal region enlargement step of enlarging the liquid film removal region while maintaining a state in which the processing liquid supply to the upper surface of the substrate is stopped, wherein the first gas generates a first gas stream along the upper surface upon intersecting the upper surface so as to push the liquid film outwardly and enlarge the liquid removal region, the second gas is discharged, from above the center of the substrate, radially around the center of the substrate without forming a liquid film removal region on the upper surface of the substrate such that the second gas generates a second gas stream flowing above the first gas stream and along an upper surface of the liquid film outside the liquid film removal region being enlarged by the first gas stream, the second gas discharge step is started before start of the first gas discharge step, whereby the formation of the liquid film removal region begins after the upper surface of the liquid film around the center of the substrate has been placed in an atmosphere containing the vapor of low surface tension liquid having the lower surface tension than the processing liquid and the nozzle is stationarily placed above the center of the substrate throughout the first gas discharge step, the second gas discharge step and the liquid film removal region enlargement step.

2. The substrate processing method according to claim 1, wherein the nozzle further includes a first cylindrical member within which a first flow path is formed, and a flange formed in a lower end portion of the first cylindrical member, the lower end portion of the cylindrical member forming the first discharge port, the first gas flows through the first flow path to be supplied to the first discharge port, and the first gas having been discharged from the first discharge port passes through a space defined between the upper surface of the substrate and the flange.

3. The substrate processing method according to claim 2, wherein the annular second discharge port is arranged higher than the flange.

4. The substrate processing method according to claim 3, wherein the nozzle further includes a second cylindrical member that encloses the first cylindrical member and that defines, between the first and second cylindrical members, a second flow path along which the second gas is passed, and the annular second discharge port is formed with the second cylindrical member and the flange.

5. The substrate processing method according to claim 1, wherein the first gas discharge step is performed while the second gas discharge step is performed.

6. The substrate processing method according to claim 1, wherein the liquid film removal region enlargement step includes a first flow rate increasing step of gradually increasing a flow rate of the first gas discharged from the first discharge port after start of the discharge of the first gas, and the substrate processing method further includes a second flow rate increasing step of gradually increasing a flow rate of the second gas discharged from the second discharge port after start of the discharge of the second gas.

7. The substrate processing method according to claim 1, wherein the processing liquid includes a rinse liquid, and the low surface tension liquid includes an organic solvent.

8. The substrate processing method according to claim 1, wherein, in the first gas discharge step and the second gas discharge step, an opposite member having an opposite surface that is opposite to an entire region of the upper surface of the substrate is placed close to the upper surface of the substrate such that a space is defined between the entire region of the upper surface of the substrate and the opposite surface.

9. The substrate processing method according to claim 1, wherein the annular second discharge port opens laterally, and is annular around the first discharge port when viewed perpendicularly to the upper surface of the substrate.

10. The substrate processing method according to claim 1, wherein the liquid film removal region enlargement step further includes a step of rotating the substrate around a rotational axis passing through the center of the substrate, and a step of gradually increasing a rotation speed of the substrate during the substrate rotating step.

\* \* \* \* \*